United States Patent [19]

Marnier

[11] Patent Number: 4,961,819
[45] Date of Patent: * Oct. 9, 1990

[54] SYNTHESIS IN FLUX OF CRYSTALS AND EPITAXIES FROM FROM ISOTYPIC SOLID SOLUTIONS OF KTIOPO4

[75] Inventor: Gérard Marnier, Jarville, France

[73] Assignee: Centre National de la Recherche Scientifique, Paris, France

[*] Notice: The portion of the term of this patent subsequent to May 24, 2005 has been disclaimed.

[21] Appl. No.: 384,105

[22] Filed: Jul. 24, 1989

Related U.S. Application Data

[63] Continuation of Ser. No. 146,928, Jan. 22, 1988, abandoned, which is a continuation-in-part of Ser. No. 889,777, Jul. 28, 1986, Pat. No. 4,746,396.

[30] Foreign Application Priority Data

Jan. 23, 1987 [FR] France .............................. 87 00811

[51] Int. Cl.$^5$ .............................................. C30B 9/12
[52] U.S. Cl. .................... 156/623 R; 156/621; 156/622; 156/625; 156/DIG. 70; 156/DIG. 71; 156/DIG. 75; 156/DIG. 81; 423/306
[58] Field of Search .................... 156/621, 622, 623 R, 156/624, DIG. 70, DIG. 71, DIG. 75, DIG. 81; 423/306

[56] References Cited

U.S. PATENT DOCUMENTS

| | | | |
|---|---|---|---|
| 3,949,323 | 4/1976 | Bierlein et al. | 156/DIG. 71 |
| 4,231,838 | 11/1980 | Gier | 156/607 |
| 4,305,778 | 12/1981 | Gier | 156/DIG. 75 |
| 4,582,562 | 4/1986 | Tamaki et al. | 156/624 |
| 4,724,038 | 2/1988 | Pastor er al. | 156/DIG. 71 |
| 4,746,396 | 5/1988 | Marnier | 156/623 R |

OTHER PUBLICATIONS

Brice, The Growth of Crystals from Liquids, North-Holland Publishing Company, Amsterdam, 1973, pp. 301 to 305.
Jacco et al., Flux Growth and Properties of KTiOPO4, Journal of Crystal Growth, 70 (1984), pp. 484–488.

Primary Examiner—Olik Chaudhuri
Assistant Examiner—Robert M. Kunemund
Attorney, Agent, or Firm—Larson and Taylor

[57] ABSTRACT

The synthesis in flux of KTP and its isotypes of the formula $K_a Rb_{1-a} TiOP_b As_{1-b} O_4$ comprises:
the use of the hydroxides of potassium and rubidium as flux,
heating to a temperature of 600° to 800° C. for about 25 to 100 hours with a thermal gradient of 5° to 25° C./cm,
the introduction of a seed crystal close to the surface of the solution, followed by the maintenance of the stage temperature or cooling at 1° to 5° C. per hour.

8 Claims, 1 Drawing Sheet

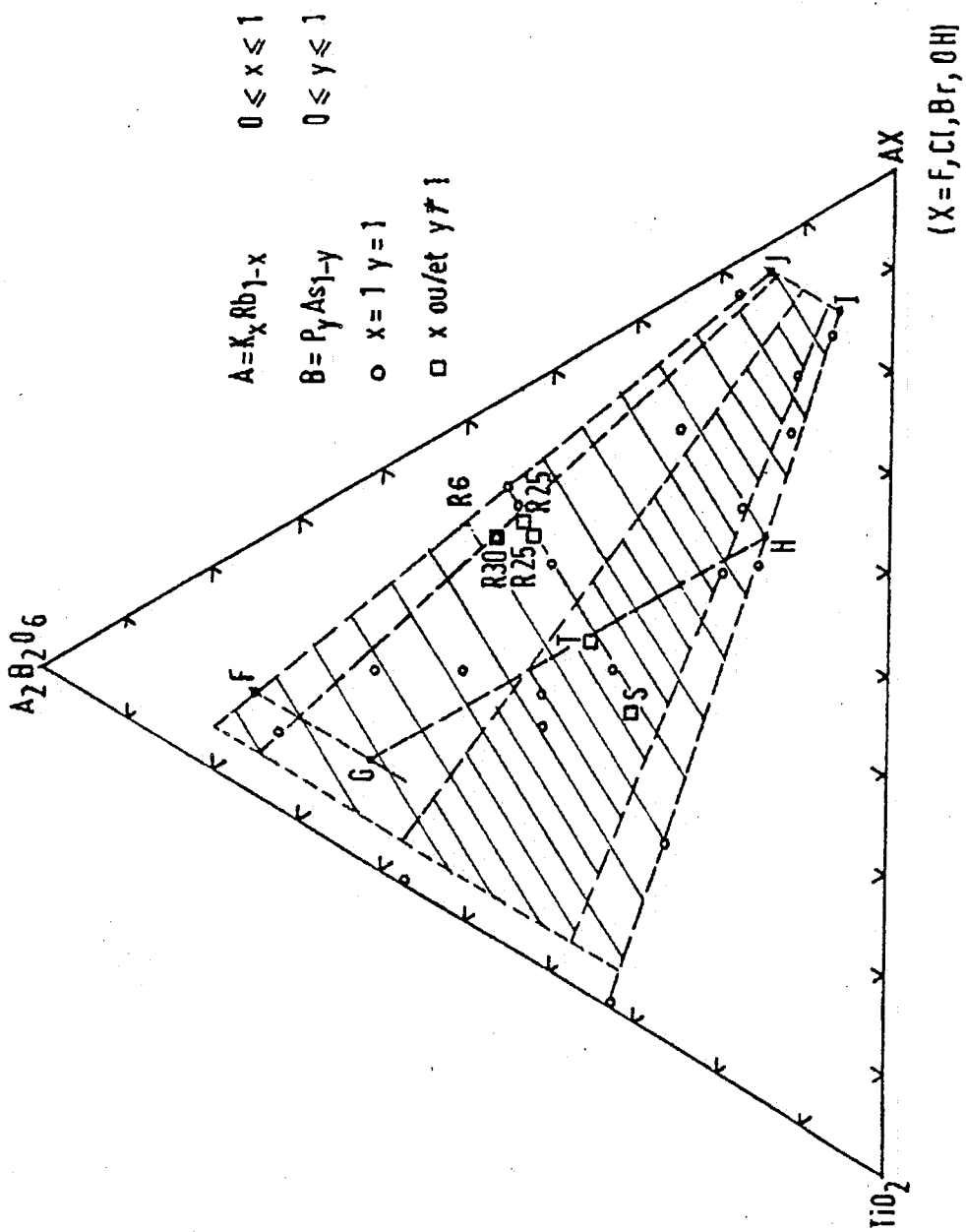

SYNTHESIS IN FLUX OF CRYSTALS AND EPITAXIES FROM FROM ISOTYPIC SOLID SOLUTIONS OF KTIOPO4

This application is a continuation of application Ser. No. 07/146,928 filed Jan. 22, 1988 now abandoned which is a continuation-in-part of application Ser. No. 06/889,777 filed Jul. 28, 1986, now U.S. Pat. No. 4,746,396.

The subject of the invention is syntheses in flux of crystals and epitaxies from isotypic solid solutions of KTiOPO4 (or the monophosphate of potassium and titanium, also designated hereafter as KTP).

It will be recalled that said patent application relate to a procedure for the synthesis in flux of crystals of the KTP type by using as flux the halides of the alkali metals corresponding to the crystals to be synthesized as well as an excess of the alkali metaphosphates and oxides necessary for the preparation of the crystals over and above the amounts needed to react with titanium oxide for the synthesis of the compound.

According to this procedure, which comprises the placing of a mixture of titanium oxide and the oxides or salts of the constituents of the desired compound in a crucible and the introduction of the latter into a furnance, at least one alkali halide is added to this mixture, the mixture formed is brought to a stage temperature having a value between about 1100° C. and 800° C. for about 25 to 100 h, then the crucible is cooled to a temperature close to ambient temperature at a rate less than about 50° C./h and the crystals formed are separated.

More recent studies by the inventors have enabled them to define the conditions for the synthesis of crystals of this type at a relatively low temperature of the order of 600° to 750° C. by using essentially alkali chlorides, but also alkali bromides and fluorides.

In this temperature range it has thus proved possible to replace the alkali halides by alkali hydroxides, whereas their use at high temperature could not be envisaged given the fact that these hydroxides decompose extensively above 800° C. in the mixtures used.

According to another aspect, the inventors have also prepared isotypes of KTP by using as flux either alkali hydroxides or alkali halides according to said U.S. patent application.

According to another aspect the inventors have defined the conditons of growth and epitaxy of KTP and its isotypes.

The procedure according to the invention for the synthesis in flux of KTP and its isotypes corresponding to the formula $K_aRb_{1-a}TiOP_bAs_{1-b}O_4$ in which $0 \leq a \leq 1$ and $0 \leq b \leq 1$, comprises the placing of a mixture of titanium oxide and the oxides, oxide precursors or salts of the metal constituents of the desired compounds in a crucible and the introduction of latter into a furnace.

This procedure is characterized by the following steps:

the hydroxides of K or Rb are used as flux, the mixture is brought to a temperature of about 600° to 800° C. for about 25 to 100 hours by using a thermal gradient of about 5° to 25° C./cm, a seed crystal is introduced close to the surface of the solution, then the stage temperature is maintained or cooled at 1° to 5° C./h, the crystals are separated from the vitreous material formed during the process.

BRIEF DESCRIPTION OF THE DRAWINGS

The sole figure shows a ternary diagram of $TiO_2$, $A_2B_2O_6$ and AX, where A represents $K_xRb_{1-x}$, B represents $P_yAs_{1-y}$, X represents OH, $0 \leq x \leq 1$ and $0 \leq y \leq 1$.

According to a preferred feature of the invention, the composition of the mixture used in the procedure is chosen in the zone of the ternary diagram $TiO_2$, $A_2B_2O_6$, AX represented on the only figure by the surface of the pentagon FGHIJ, in which A represents $K_xRb_{1-x}$, B represents $P_yAs_{1-y}$, X represents OH, $0 \leq x \leq 1$, $0 \leq y \leq 1$.

In a preferred manner, an excess of $A_2B_2O_6$ is used.

In view of the results obtained for the growth of KTP in flux in the hatched zones of the ternary diagram $A_2B_2O_6$, $TiO_2$, AX in which X=F, Cl, Br, the inventors have defined by following the operating procedure of said U.S. patent application, the conditions of growth and epitaxy for compounds of the general formula $K_aRb_{1-a}TiOP_bAs_{1-b}O_4$, $0 \leq a \leq 1$ and $0 \leq b \leq 1$ in molten mixtures, the initial composition of which are given in the pseudo-ternary diagram $A_nB_2O_6$, $TiO_2$, AX in which $A=K_xRb_{1-x}$ with $0 \leq x \leq 1$, $B=P_yAs_{1-y}$ with $0 \leq y \leq 1$, X=Cl, F, Br, OH and n varies from 2 to 4.

Advantageously, n is equal to 2. The initial compositions are then in the pseudoternary diagram $A_2B_2O_6$, $TiO_2$, AX. The molar fractions respectively $\alpha$, $\beta$, $\gamma$, are approximately comprised between 0.78 and 0.06 for $\alpha$, between 0.3 and 0.06 for $\beta$ and between 0.87 and 0.05 for $\gamma$.

Thus, the invention also relates to a procedure for the synthesis in flux more specifically aimed at the production of compounds of formula $K_aRb_{1-a}TiOP_bAs_{1-b}O_4$ by using alkali hydroxides defined above or, as a variant, by using the procedure of synthesis in flux using alkali halides which comprises.

1. forming a flux composition by combining (a) titanium oxide, (b) oxides, oxide precursors or salts of the constituents of the compound to prepare, the proportions of (a) and (b) such that the ratio of the molar fraction of alkali oxide and of the molar fraction of $P_2O_5$ is equal to 1 or is comprised between 1 and 2, (c) a halide flux selected from Cl, F or Br of the alkali metal constituent of said isotypes, the proportions of (a), (b) and (c) being such that a low viscosity mixture is obtained at a temperature of 600°–800° C., and that the formation of $K(Ti)_2(PO_4)_3$ is avoided, 2. heating the mixture of (a), (b) and (c) to a plateau temperature of 600° to 1100° C., particularly of 600° to 750° C., 3. cooling the mixture to approximately ambient temperature at a rate less than approximately 50° C./h; and 4. separating the compound crystals from the vitreous material formed during the process.

Conditions of growth on a seed crystal at constant temperature with $\beta < 0.3$ prove to be particularly advantageous.

In order to prepare the arsenates, it is preferred to have recourse to a flux of alkali bromides.

The table below summarizes the initial chemical compositions of the molten starting mixtures mentioned in the diagram of the sole figure and the chemical composition of the crystals obtained when crystals are synthesized from solid solutions according to a preferred embodiment of the invention.

The table below summarizes the initial chemical compositions of the initial molten mixtures and the chemical composition of the crystals obtained when crystals are synthesized from solid solutions.

The initial compositions of these molten mixtures correspond to the general formula:

$$\alpha[(xK_2O+(1-x)Rb_2O)+(yP_2O_5+(1-y)As_2O_5)]+\beta TiO_2+\gamma[x'KX+(1-x')RbX]$$

with $\alpha+\beta+\gamma=1$, $0\leq x\leq 1$ and $0\leq y\leq 1$ and $0\leq x'\leq 1$.

The representation in the ternary diagram corresponds to:

$$[A_2B_2O_6]+\beta TiO_2+\gamma[AX]$$

The crystals obtained from solid solutions correspond to the following composition:
$K_aRb_{1-a}TP_bAs_{1-b}$ with $0\leq a\leq 1$ and $0\leq b\leq 1$.

| | α | β | γ | x | y | X | a | b |
|---|---|---|---|---|---|---|---|---|
| R11 | 0.353 | 0.294 | 0.353 | 0.4 | 1 | Cl | 0.43 | 1 |
| R12 | 0.353 | 0.294 | 0.353 | 0.66 | 1 | Cl | 0.75 | 1 |
| R13 | 0.353 | 0.294 | 0.353 | 0.66 | 1 | Cl | 0.9 | 1 |
| R14 | 0.353 | 0.294 | 0.353 | 0 | 1 | Cl | — | — |
| R21 | 0.353 | 0.294 | 0.353 | 1 | 0.5 | Cl | 1 | 0.57 |
| R22 | 0.353 | 0.294 | 0.353 | 1 | 0.3 | Cl | 1 | 0.39 |
| R23 | 0.353 | 0.294 | 0.353 | 0.66 | 0.5 | Cl | 0.72 | 0.52 |
| R25 | 0.424 | 0.153 | 0.424 | 0.4 | 1 | Cl | — | — |
| R'R 25 | 0.430 | 0.140 | 0.430 | 0.47 | 0.9 | Cl | — | — |
| R26 | 0.308 | 0.385 | 0.308 | 1 | 0 | Cl | 1 | 0 |
| R27 | 0.308 | 0.385 | 0.308 | 1 | 0.3 | Br | 1 | 0.42 |
| R29 | 0.308 | 0.385 | 0.308 | 0.75 | 0.5 | Cl | 0.72 | 0.55 |
| R6 | 0.472 | 0.335 | 0.393 | 1 | 1 | OH | 1 | 1 |
| R30 | 0.472 | 0.335 | 0.393 | 0.1 | 1 | P | — | — |
| R23 | 0.308 | 0.385 | 0.308 | 0 | 0 | Cl | 0 | 0 |

It will be seen that the points T and S in the diagram represent R11, R12, R13, R14, R21, R22, R23 and R26, R27, R28, R29, respectively.

The invention also relates to the preparation of monocrystalline thin layers of compositions different from the bulk substrate.

Other advantages and properties of the invention will become apparent in the following examples which illustrate the synthetic procedures of the invention, by referring to the sole figure relating to the ternary diagram $A_2B_2O_6 \cdot TiO_2 \cdot AX$.

EXAMPLE 1

Synthesis of crystals of KTiAs (experiment R26) in an open platinum crucible 25 mm in diameter and 60 mm high. The following starting mixture is introduced:

R26: 43.2 g $KH_2AsO_4 + 12$ g $TiO_2 + 9$ g KCl

The mixture is introduced in successive steps of dehydration-densification.

The crucible is closed by means of a platinum foil and introduced into a furnace with a gradient. The furnace is heated to 950° C. within a few hours. This temperature is maintained for 96 hours. The evaporation of the alkali halide is then maximal.

The furnace is then cooled to 500° C. at 1° C./h, then to ambient temperature at 10° C./h.

Weighing of the crucible after the experiment reveals that the evaporation of the alkali halide has been considerable.

The crystals are extracted by dissolution of the glass in hot water. Only one compound crystallizes: KTiOAsO4, it is identified by means of X-ray analysis and electronic microprobe analysis.

Two families of crystals are obtained. One consists of transparent crystals of $KTiOAsO_4$ of 20 mm³ resulting from growth by evaporation, the other is composed of very tiny crystals of 0.1 mm in length obtained by slow cooling.

EXAMPLE 2

(experiment R28). The procedure is the same as that in example 1 and the following initial mixture is employed:

R28: 54.3 g $RbH_2AsO_4 + 12$ g $TiO_2 + 14.5$ g RbCl.

The crucible is introduced into the furnace and heated to 800° C. over a period of 60 hours. The rate of cooling down to 500° C. is about 3° C./h and then about 10° C./h to ambient temperature. Transparent crystals of $RbTiOAsO_4$ of 10 mm³ are obtained.

EXAMPLE 3

(experiments R23, R29). The experiments R23 and R29 are performed under the same conditions as those of example 1. The respective starting mixtures are the following:

R23: 4.08 g $KH_2PO_4 + 0.53$ g $KOH + 1.47$ g $KCl + 4.2$ g $RbOH + 2$ g $TiO_2 + 3.45$ g $As_2O_5 + 1.24$ g RbCl.

R29: 4.4 g $RbH_2PO_4 + 3.3$ g $KH_2PO_4 + 8.6$ g $KH_2AsO_4 + 4.8$ g $TiO_2 + 2.7$ g $KCl + 1.5$ g RbCl.

The mixtures are heated up to 800° C. during 72 hours, then cooled to 500° C. at 3° C./h and then to ambient temperature at 10° C./h. The transparent crystals of $K_aRb_{1-a}P_bAs_{1-b}O_4$ of 20 mm³, with a=0.72 and b=0.52 for the composition R23 and with a=0.72 and b=0.55 for the composition R29 are extracted.

The experiments R11, R12, R13, R21 and R22 are similar. The details concerning the initial compositions of the baths as well as the composition of the crystals derived from the corresponding solid solutions are indicated in the tabular summary.

EXAMPLE 4

(experiment R27). The same procedure as that used in example 1 is applied to the following mixture in which X=Cl is replaced by X=Br:

R27: 3.9 g $KH_2PO_4 + 12.1$ g $KH_2AsO_4 + 4.8$ g $TiO_2 + 5.75$ g KBr.

Transparent crystals of $KTiOP_{0.42}As_{0.58}O_4$ of 10 to 15 mm³ are obtained.

EXAMPLE 5

Growth experiment on a seed crystal of KTP starting with a bath in which X=OH (experiment R6). The following mixture is introduced into a platinum crucible 25 mm in diameter and 60 mm high:

R6: 42.82 g $KH_2PO_4 + 3.59$ g $TiO_2 + 7.35$ g KOH.

The mixture is dehydrated, then rendered more dense. The open crucible is introduced into the furnace. Within a few hours a vertical temperature gradient of 20° C./cm is established in the crucible with the hot zone at the bottom of the crucible. This temperature gradient is maintained throughout the experiment. The crystal of KTP is suspended from a platinum wire and placed in the cold zone of the crucible at a constant temperature close to 685° C.

Inspection of the crystal following its withdrawal after 17 hours reveals growth of good quality associated with a low linear growth rate: 11 Å/s.

EXAMPLE 6

Growth experiment on a seed crystal of $K_{0.43}Rb_{0.57}TP$ starting with a bath of the composition R25. The mixture has the following composition;

R25: 34.43 g RbOH + 15.67 g $KH_2PO_4$ + 19.32 g $NH_4H_2PO_4$ + 4.07 g $TiO_2$ + 10.15 g RbCl + 4.30 g KCl.

The experimental conditions are identical with those of example 5

A thermal gradient of 15° C./cm is established in the crucible. Under these conditions the temperature of the crystal is about 645° C. The crystal is withdrawn after 24 hours. The linear rate of growth is close to 30 Å/s.

EXAMPLE 7

Growth experiment on a seed crystal of RbTP starting with a bath of composition R14:

R14: 31.21 g $KH_2PO_4$ + 7.64 g RbOH + 4.29 g $NH_4H_2PO_4$ + 8.88 g $TiO_2$ + 8.55 g KCl + 2.26 g RbCl.

The same conditions are used as in example 5. The crystal is at a temperature of 690° C. in a gradient of 6° C./cm. The linear rate of growth is about 11 Å/s.

EXAMPLE 8

Epitaxial growth experiment on a seed crystal of KTP starting with a bath of composition R25:

R25: 34.43 g RbOH + 15.67 g $KH_2PO_4$ + 19.32 g $NH_4H_2PO_4$ + 4.07 g $TiO_2$ + 10.15 g RbCl + 4.30 g KCl.

The procedure for the epitaxial growth experiments is identical with those of example 5.

The crystal is at a temperature of 645° C. in a thermal gradient of 10° C./cm.

The crystal is withdrawn after 20 hours. The monocrystalline layer of epitaxial growth has the composition $K_{0.65}Rb_{0.35}TP$. The low linear growth rate obtained: 15 Å/s is compatible with a thin deposit of good optical quality. The chemical composition of the thin layer is determined by analysis with the electronic microprobe of Castaing.

EXAMPLE 9

Epitaxial growth experiment on a seed crystal of $K_{0.75}Rb_{0.25}TP$ starting with a bath of composition R25.

R25: 34.43 g RbOH + 15.67 g $KH_2PO_4$ + 19.32 g $NH_4H_2PO_4$ + 4.07 $TiO_2$ + 10.15 g RbCl + 4.30 g KCl.

The operating conditions are identical with those of example 5.

The $K_{0.75}Rb_{0.25}TP$ crystal is at a temperature of 645° C. in a thermal gradient of 10° C./cm. The crystal is withdrawn from the bath after 20 hours. Its growth rate is about 15 Å/s. The epitaxial growth layer has the composition: $K_{0.62}Rb_{0.38}TP$.

EXAMPLE 10

Epitaxial growth experiment on a seed crystal of KTP starting with a bath of composition R'25:

R'25: 34.43 g RbOH + 15.67 g $KH_2PO_4$ + 5.67 g $KH_2AsO_4$ + 19.32 g $NH_4H_2PO_4$ + 4.07 g $TiO_2$ + 10.15 g RbCl + 5.45 g KCl.

The conditions of the experiment are identical with those of example 5. In this experiment the crystal is placed at a temperature of 650° C. in a shallow thermal gradient: 5° C./cm. The crystal is withdrawn after 24 hours. The growth rate is about 5 Å/s. The chemical analysis of the epitaxial growth layer gives a composition of $K_{0.72}Rb_{0.28}TP_{0.93}As_{0.07}$.

EXAMPLE 11

Epitaxial growth experiment on a seed crystal of $K_{0.43}Rb_{0.57}TP$ starting with a bath of composition R30.

R30: 24.88 g RbOH + 1.84 g $KH_2PO_4$ + 13.96 g $NH_4H_2PO_4$ + 1.54 g $TiO_2$ + 0.33 g KF + 5.28 g RbF

The procedure used is the same as in example 5, with X=OH replaced by X=F.

The crystal of $K_{0.43}Rb_{0.57}TP$ is placed at a temperature of 690° C. in a thermal gradient of 20° C./cm. The experiment lasts about 20 hours. The growth rate is about 10 Å/s and the composition of the epitaxial growth layer is $K_{0.15}Rb_{0.85}TP$.

EXAMPLE 12

Epitaxial growth experiment on a KTP crystal starting with a bath having initial composition R40 with the same $\alpha$, $\beta$, $\gamma$ stoechiometric coefficients as the bath of composition R13 but wherein an excess of alkaline oxides is introduced (10% of the molar fraction (expressed by $\gamma$) of the alkaline halogenides are substituted by 5% of alkaline oxides $A_2O$ wherein $A=K_xRb_{1-x}$ R40: 25.1 g $K_2HPO_4$ + 6.5 g $RbH_2PO_4$ + 11.3 g $(NH_4)H_2PO_4$ + 8.1 g $TiO_2$ + 7.1 g KCl + 1.8 g RbCl The conditions of the experiment are similar to those of example 5.

The furnace is maintained at a constant temperature close to 850° C. The KTP crystal is in a thermal gradient of 5° C./cm. It is withdrawn from the bath 15 hours later, the growth rate of the epitaxial layer is of 5 Å/s, its composition corresponds to a=0.9

EXAMPLE 13

Growth experiment of a crystal having the composition $K_{0.9}Rb_{0.1}TP$ in a bath having initial composition R41 with the same $\alpha$, $\beta$, $\gamma$ stoechiometric coefficients as the bath of composition R13 but wherein an excess of alkaline oxides is introduced, expressed by the substitution of 90% of the molar fraction of alkaline halogenides by 45% of alkaline oxides $A_2O$ wherein $A=K_xRb_{1\%}$ R41: 36.1 g $K_2HPO_4$ + 9.3 g $RbH_2PO_4$ + 5.1 g $(NH_4)H_2PO_4$ + 8.4 g $TiO_2$ + 0.8 K Cl + 0.2 g RbCl The conditions of the experiment are similar to those of example 5.

A thermal gradient of 5° C./cm at a temperature close to 850° C. is maintained in the furnace. The crystal is extracted after 20 hours. The epitaxial monocrystalline layer has good qualities resulting from the low growth rate: 10 Å/s.

STUDIES AND CHARACTERIZATION OF THE CRYSTALS

They were identified by means of X-rays using the powder and rotating crystal methods.

The measurements of the parameters of the crystals were carried out on an automatic diffractometer.

The chemical analysis by the electronic microprobe of Castaing made it possible to establish the composition of the crystals from solid solutions and from epitaxial deposits.

The preparation of monocrystalline thin layers of different compositions makes it possible to vary the optical and electro-optical properties in useful proportions in order that these materials may be used in integrated optics for the construction of an optical switch, for example.

The areas of application of the bulk materials are analogous to those of KTP.

Thus, the combination of YAG Nd. isotypes of KTP constitute an alternative to inert gas lasers.

Such a source offers the advantages of compactness and reliability.

it is possible to envisage the replacement of lasers of low power such as the He-Ne laser for use in research and metrology. This implies the possibility of constructing the lining in a thin layer of a non-linear crystal.

In addition, from the point of view of medical uses, it is of interest to have available a system with two wavelengths, one in the infrared and the other in the visible.

REFERENCES FOR THE PRODUCTS USED

| | |
|---|---|
| $KH_2PO_4$: | MERCK type pro analysi (reference 4873) |
| $TiO_2$: | MERCK type Lab (reference 808 |
| KOH: | MERCK type pro analysi (reference 5021) |
| RbCl: | MERCK type pro analysi (reference 7615) |
| KCl: | MERCK type pro analysi (reference 4936) |
| $As_2O_5, \frac{5}{3} H_2O$: | MERCK type pro analysi (reference 114) |
| KBr: | MERCK type pro analysi (reference 4905) |
| KF: | MERCK type pro analysi (reference 4994) |
| $NH_4H_2PO_4$: | PROLABO type Normapur (reference 21305.29) |
| RbF: | CERAC purity 99,9 (reference R-1035) |
| RbOH 50% aqueous: | VENTRON solution 99% (reference 16608) |
| $K_4P_2O_7$: | CARLO ERBA type RPE (reference 473915) |

Preparation of $As_2O_5$, $KH_2AsO_4$, $RbH_2PO_4$, $RbH_2AsO_4$:

| | |
|---|---|
| $As_2O_5$: | dehydration of $As_2O_5, \frac{5}{3} H_2O$ |
| $KH_2AsO_4$: | reaction of $As_2O_5, \frac{5}{3} H_2O$ with KOH |
| $RbH_2PO_4$: | reaction of $NH_4H_2PO_4$ with RbOH |
| $RbH_2AsO_4$: | reaction of $As_2O_5, \frac{5}{3} H_2O$ with RbOH |

We claim:

1. A process for the synthesis in flux of crystals and epitaxies from KTP or from isotypic solids solutions thereof having the following formula: $K_aRb_{1-a}TiOP_bAs_{1-b}O_4$ in which $0 \leq a \leq 1$ and $0 \leq b \leq 1$ comprising combining in a crucible (a) titanium oxide, (b) oxides, oxide precursors or salts of the metal constituents of said $K_aRb_{1-a}TiOP_bAs_{1-b}O_4$ compound and introducing said crucible into a furnace, wherein a flux composition is formed in said crucible by adding to (a) and (b) a derivative of K or Rb selected from hydroxides or halogenides, the flux composition is at a pressure near the atmospheric pressure is brought to a temperature of about 600° C. to 800° C. for about 25 to 100 hours using a furnace containing said crucible to obtain a thermal gradient such that the temperature decreases from the bottom to the top of the crucible, the stage temperature is maintained or cooled at 1° to 5° C. C/h, the crystals are separated from the vitreous material formed during the process with the proviso that when an halogenide of K or Rb is added to the flux composition, the initial composition of said flux composition is included into the pseudoternary diagram $A_nB_2O_6$, $TiO_2$, AX in which n varies from 2 to 4, $A=K_xRb_{1-x}$ with $0 \leq x \leq 1$ and $B=P_yAs_{1-y}$ with $0 \leq y \leq 1$ and $X=F, Cl, Br$.

2. Process according to claim 1, wherein the composition of the mixture is selected within the zone of the ternary diagram $TiO_2$, $A_2B_2O_6$, AX, represented in the sole figure by the surface of the pentagon FGHIJ, in which A represents $K_xRb_{1-x}$ with $0 \leq x \leq 1$, and X represents OH and B represents $P_yAs_{1-y}$ with $0 \leq y \leq 1$.

3. Process according to claim 1 wherein ABr is used as a flux for the synthesis of arsenates.

4. Process according to claim 1 wherein said KTP or isotypes of the formula: $K_aRb_{1-a}TiOP_bAs_{1-b}O_4$ in which $0 \leq a \leq 1$ and $0 \leq b \leq 1$ are obtained under the form of crystal.

5. Process according to claim 1 wherein said KTP or isotypes of the formula: $K_aRb_{1-a}TiOP_{1-b}O_4$ in which $0 \leq a \leq 1$ and are obtained under the form of expitaxial layers on the face of an isotype seed crystal.

6. Process according to claim 2, wherein the crystal growth on said seed is carried out by using compositions included in the hatched zone FGHIJ represented on said sole figure such that the molar fraction $\beta$ of $TiO_2$ is less than 0.3 (line GH) and higher than 0.06 (point J) referring to the ternary diagram $\alpha[A_2B_2O_6]+\beta TiO_2+\gamma[AX]$, $\alpha$ and $\gamma$ being the molar fractions of $B_2O_6$ and of AX.

7. Process according to claim 1 wherein the thermal gradient is of about 1° to 25° C./cm.

8. A process according to claim 1 wherein a seed crystal is introduced close to the surface of the solution.

* * * * *